United States Patent [19]
Kurz

[11] Patent Number: 5,387,121
[45] Date of Patent: Feb. 7, 1995

[54] ZERO INSERTION FORCE SOCKET

[76] Inventor: Edward A. Kurz, 172 Pinebank Rd., Flemington, N.J. 08822

[21] Appl. No.: 119,563

[22] Filed: Sep. 13, 1993

[51] Int. Cl.⁶ ............................................ H01R 4/52
[52] U.S. Cl. .................................... 439/342; 439/259
[58] Field of Search ............................... 439/259–264, 439/266, 267, 268, 269, 342, 341

[56] References Cited

U.S. PATENT DOCUMENTS

| | | | |
|---|---|---|---|
| 4,331,371 | 5/1982 | Ichimura et al. | 439/269 |
| 4,343,524 | 8/1982 | Bright et al. | 339/74 |
| 4,350,402 | 9/1982 | Douty et al. | 339/74 |
| 4,391,408 | 7/1983 | Hanlon et al. | 339/75 |
| 4,420,205 | 12/1983 | Kirkman | 339/74 |
| 4,519,660 | 5/1985 | Ichimura et al. | 339/75 |
| 4,713,020 | 12/1987 | Awano et al. | 439/267 |
| 4,744,768 | 5/1988 | Rios | 439/262 |
| 4,836,798 | 6/1989 | Carter | 439/268 |
| 4,846,713 | 6/1989 | Matsuoka | 439/260 |
| 4,887,974 | 12/1989 | Ichimura et al. | 439/259 |
| 4,889,499 | 12/1989 | Sochor | 439/268 |
| 4,988,310 | 1/1991 | Bright et al. | 439/259 |
| 5,013,256 | 5/1991 | Maksuoka et al. | 439/264 |
| 5,057,031 | 10/1991 | Sinclair | 439/259 |
| 5,123,855 | 6/1992 | Petersen | 439/266 |
| 5,186,642 | 2/1993 | Matsuoka et al. | 439/268 |

Primary Examiner—Larry I. Schwartz
Assistant Examiner—Hien D. Vu
Attorney, Agent, or Firm—Thomas L. Adams

[57] ABSTRACT

A socket can connect to a plurality of dependent pins on an electrical element. The socket has an insulative base with a plurality of receptacles, each adapted to receive an electrical contact. A plate is mounted upon the insulative base to slide between an engaged position and a released position. This plate has a plurality of pin insertion holes distributed in a pattern matching that of the receptacles in the insulative base. The plate in the release position allows insertion of the dependent pins without deflecting contacts in the receptacles. A spring is mounted between the plate and the base for urging the plate toward the engaged position. A cam or similar device is mounted between the base and the plate for relatively driving them.

23 Claims, 4 Drawing Sheets

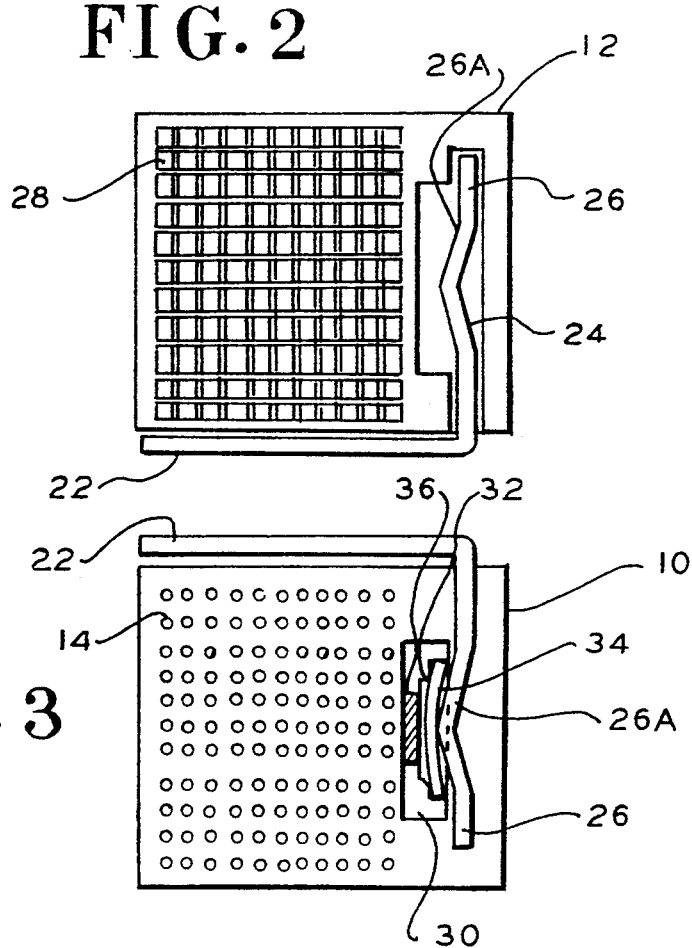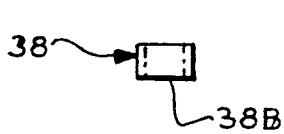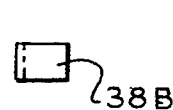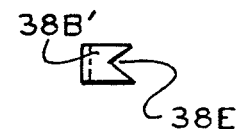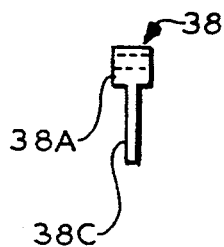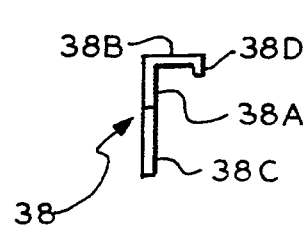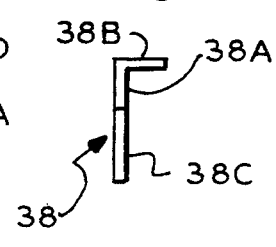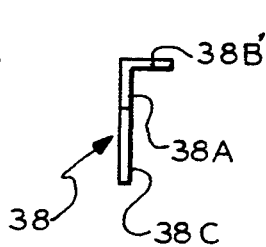

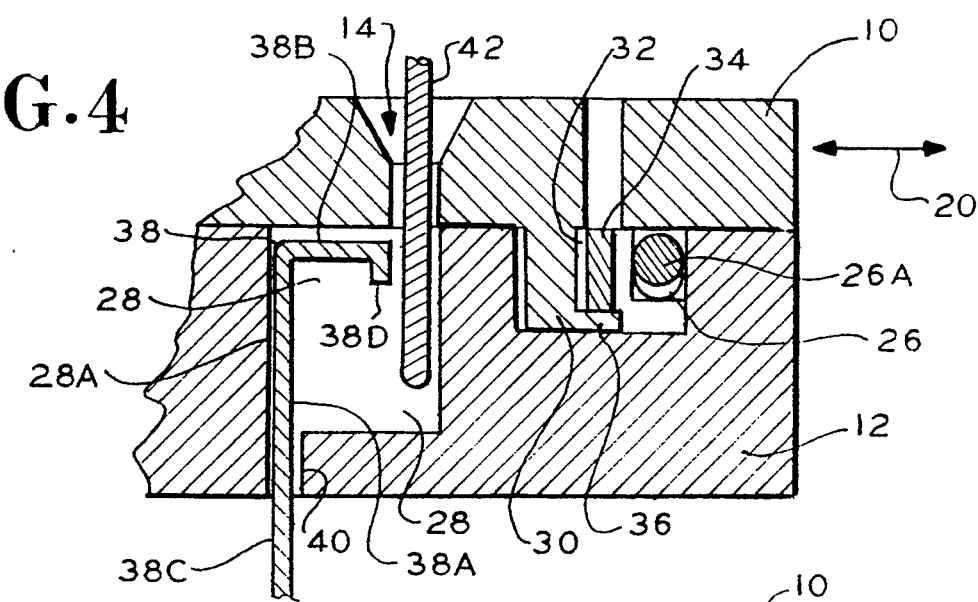
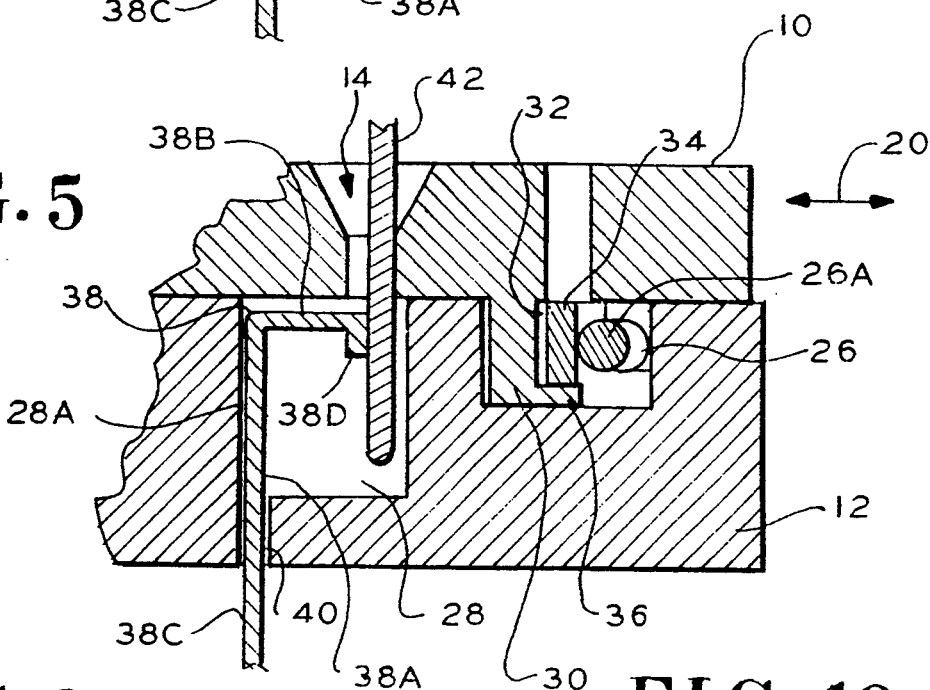
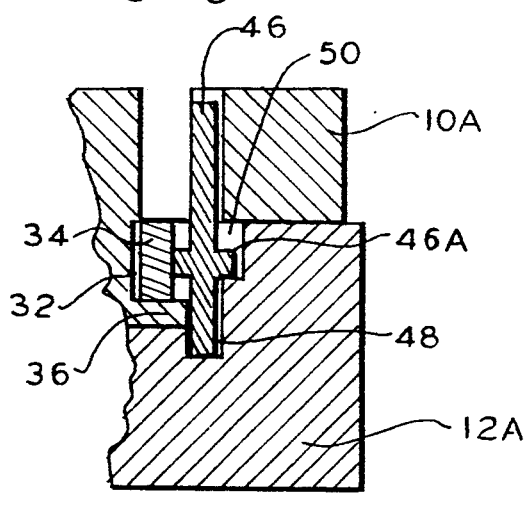
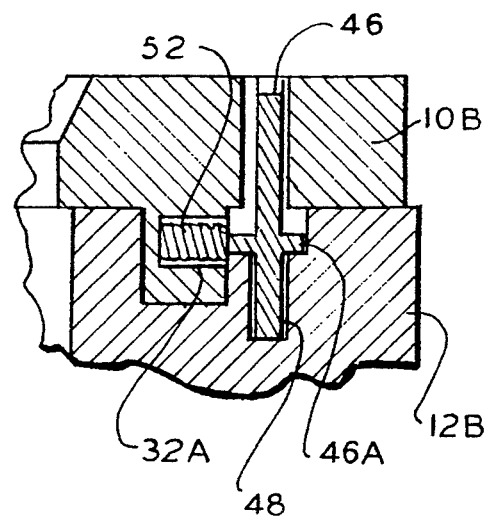

ZERO INSERTION FORCE SOCKET

BACKGROUND OF THE INVENTION

1. Field of the Invention

The present invention relates to electrical sockets, and in particular, to a socket having a base with a plurality of receptacles surmounted by a sliding plate having matching holes.

2. Description of Related Art

Electrical components are often mounted in sockets employing spring contacts. These sockets allow easy installation and replacement of electrical elements. In conventional sockets the pins of an integrated circuit (IC) are pressed into a socket to deflect the spring contacts.

Modern integrated circuits are fairly complex and have a large number of dependent pins. While the force required to insert an individual pin into a socket receptacle may be modest, simultaneously inserting a large number of pins can require a large insertion force. Such large insertion forces may damage the IC or bend its pins.

U.S. Pat. No. 4,887,974 shows in its FIGS. 1A and 1B, cantilevered contacts mounted in a base. A sliding grid mounted over the base guides the dependent pin of an electrical element. The grid is initially aligned so the pins can be inserted through the grid without touching the electrical contacts in the base. Thus, the pins can be inserted with zero insertion force. After the pins are thus inserted, the grid can be shifted relative to the base to drive the pins against the cantilevered contacts, which then deflect. These cantilevered contacts have a vertical branch and a relatively short transverse branch for touching the pin.

U.S. Pat. No. 5,013,256 shows another electrical socket whose base has a number of receptacles containing electrical contacts. The base is overlaid with another sliding grid. The socket contains a compression or torsion spring that is tensioned when the grid slides the pins against the electrical contacts in the receptacles. Thus, the spring is designed to urge the pins away from the contacts in the receptacles. The connection, however, is maintained by a lever that overcomes the spring and drives the grid to the engaged position.

U.S. Pat. No. 4,420,205 shows a similar socket in which the grid is slid relative to the base by means of a cam that can be rotated by a screw driver.

A disadvantage with sockets of this type is the need for the electrical contacts to be flexible, i.e. springy. This flexibility requires a relatively thin contact (or high operating force) as well as sufficient room to deflect.

See also U.S. Pat. Nos. 4,343,524; 4,350,402; 4,391,408; 4,519,660; 4,713,020; 4,744,768; 4,836,798; 4,846,713; 4,889,499; and 5,186,642.

Accordingly, there is a need for an improved zero insertion force socket that avoids such disadvantageous requirements as substantial deflection of the electrical contacts mounted in a base.

SUMMARY OF THE INVENTION

In accordance with the illustrative embodiments demonstrating features and advantages of the present invention there is provided a socket for connecting to a plurality of dependent pins on an electrical element. The socket includes an insulative base and a plate. The insulative base has a plurality of receptacles, each adapted to receive an electrical contact. The plate is mounted on the insulative base to slide between an engaged position and a released position. This plate has a plurality of pin insertion holes distributed in a pattern matching that of the receptacles in the insulative base. The plate, in the released position, allows insertion of the dependent pins without deflecting contacts in the receptacles. The socket includes a biasing means mounted between the plate and the base for urging the plate toward the engaged position. Also included is a drive means mounted between the base and the plate for relatively driving them.

By employing such apparatus, a relatively simple and efficient socket is provided that offers zero insertion force. In a preferred embodiment, a base has a number of receptacles containing simple electrical contacts. For example, the contacts can be metallic uprights with relatively short transverse branches for making electrical contact. In one preferred embodiment, the relatively short branch has a V-shaped notch so that a pin can be wedged inside the notch, which mechanically increases the contact force.

Preferably, the base is surmounted by a sliding plate with a matching pattern of pin insertion holes. A preferred spring (compression, leaf, torsion or otherwise) can be mounted between the base and the sliding plate to urge the plate into an engaged position where the pins touch the contacts inside the base receptacles. This spring is sufficiently elastic to avoid the need for springy contacts in the base receptacles, but sufficiently stiff to provide adequate contact force upon the pins.

In one preferred embodiment, the plate is normally in the released position, allowing easy insertion. Thereafter, a drive mechanism can apply a force through the spring to drive the plate into the engaged position to engage the contacts. In still another embodiment, the spring is mounted between the base and sliding plate remotely from the mechanism that moves the plate. In this embodiment, the mechanism can apply a force that overcomes the spring and slides the plate into a released position where pins can be inserted with zero insertion force. Thereafter, the mechanism frees the plate so the spring can drive the plate and the pins into the engaged position.

In some embodiments, this drive mechanism can be a camshaft or crankshaft that is driven by an external lever arm. Alternatively, a camshaft can be mounted vertically in the base and turned by a screwdriver or otherwise to provide the force that moves the plate with respect to the base.

BRIEF DESCRIPTION OF THE DRAWINGS

The above brief description, as well as other objects, features and advantages of the present invention will be more fully appreciated by reference to the following detailed description of presently preferred, but nonetheless illustrative embodiments in accordance with the present invention, when taken in conjunction with the accompanying drawings, wherein:

FIG. 2 is a top view of the base of FIG. 1 with the lever turned to the engaged position;

FIG. 3 is a bottom view of the sliding plate of FIG. 1 with the adjacent lever arm rotated to the engaged position;

FIG. 4 is a cross-sectional view taken along line 4—4 of FIG. 1;

FIG. 5 is a cross-sectional view similar to that of FIG. 4 but with the plate shifted to the engaged position;

FIGS. 6A, 6B and 6C are side views of electrical contacts that may be mounted in the receptacles in the base of FIG. 1;

FIGS. 7A, 7B and 7C are top views of the contacts of FIGS. 6A, 6B and 6C, respectively;

FIG. 8 is a rear view of the contact of FIG. 6A;

FIG. 9 is a cross-sectional view of a socket drive mechanism that is an alternate to that of FIGS. 4 and 5;

FIG. 10 is a cross-sectional view of a drive mechanism that is an alternate to that of FIG. 9;

DETAILED DESCRIPTION OF THE PREFERRED EMBODIMENT

Figure 1:
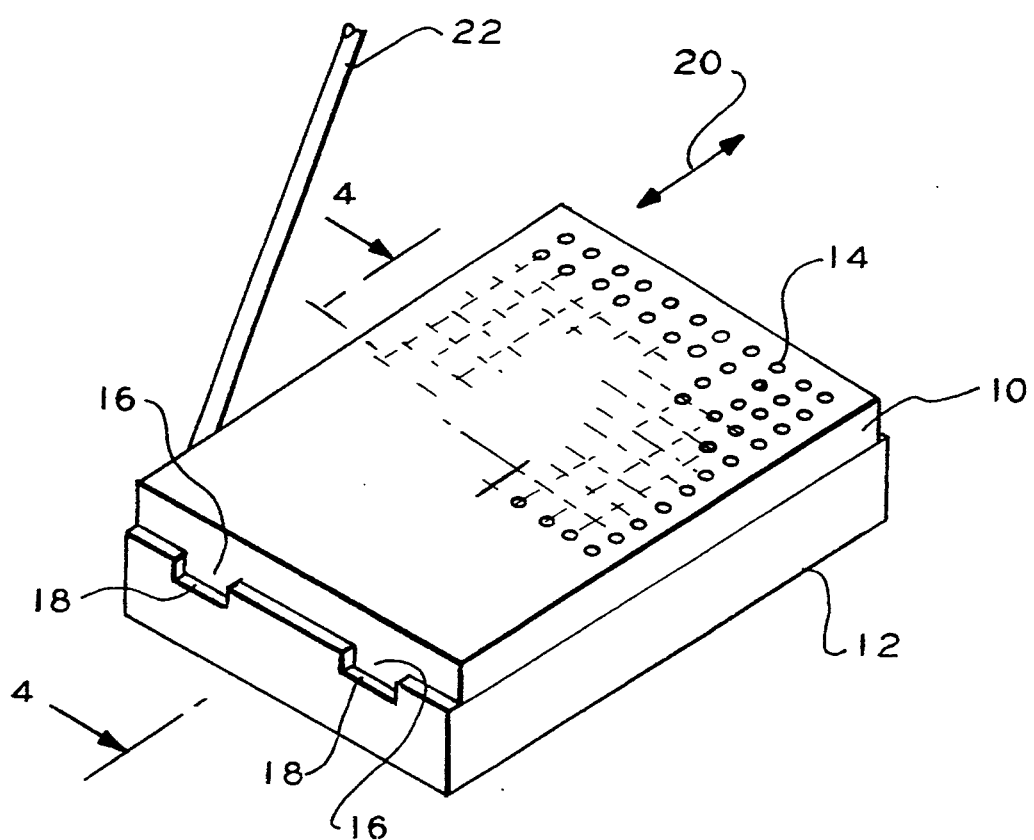
FIG. 1 is an axonometric view of a socket in accordance with the principles of the present invention.

Referring to FIG. 1, a socket is shown having a plate 10 slidably mounted atop insulative base 12. Plate 10 has an 11×11 array of pin insertion holes 14. These holes 14 are designed to accept the pins from an electrical element such as an .integrated circuit. The size of plate 10 and the number of pin insertion holes 14 can be varied depending upon the type of element to which connection is being made.

Pin insertion holes 14 do not cover the entire top of plate 10 since part is left available for a drive means for moving plate 10 relative to base 12. Lever 22 forms a part of this drive means. Plate 10 is shown having a pair of bosses or ridges 16 mounted in grooves 18 in base 12. Ridges 16 keep motion of plate 10 aligned in the direction of arrow 20, between an engaged position and a released position, more fully described hereinafter. The sliding motion of plate 10 is caused by the previously mentioned drive means, Referring to FIG. 2, base 12 is shown having a channel 24 with a T-shaped plan for holding the drive means, shown herein as previously illustrated lever 22 transversely connected to cam mechanism 26 (also referred to herein as a camshaft or a crankshaft). Shaft 26 is shown as a rod having a circular cross-section with a jog 26A providing an eccentricity that can deliver an inward thrust for the purposes to be described presently.

Alongside channel 24 is an 11×11 array of receptacles 28 designed to hold electrical contacts (illustrated hereinafter). The floors of receptacles 28 each have an aperture to hold a lower pin of the contact to be mounted in the receptacle.

Referring to FIG. 3, sliding plate 10 is shown having a rectangular boss 30 with a cavity 32 sized to hold leaf spring 34, hereinafter referred to as a biasing means. Leaf spring 34 is held in place by a hook 36 (whose outer end is sectioned away in this view for clarity) having an L-shaped cross section. Embossment 30 is designed to fit within channel 24 (FIG. 2) with enough clearance to slide in a direction transverse to leaf spring 34.

In FIG. 3, the camming mechanism 26 is shown positioned against the underside of plate 10 with the eccentricity 26A pressing against leaf spring 34 to generate a force (a force to the left in FIG. 3).

Referring to FIG. 4, the narrowed section 38C of the main branch 38A of contact 38 is mounted in pin hole 40 of receptacle 28 in previously illustrated insulative base 12. A transverse branch 38B atop contact 38 has a dependent flange 38D designed to make electrical contact with a dependent pin 42 of an electrical element, such as an integrated circuit.

Referring to FIGS. 6A, 7A and 8, contact 38 is shown as a metal stamping having a rectangular main branch 38A integral with a transverse branch 38B. A terminal dependent flange 38D is shown depending from the outer end of branch 38B. Integral with main branch 38A is a narrowed section 38C acting as a pin that can fit through the opening 40 in the underside of base 12.

Referring to FIGS. 6B and 7B, an alternate contact is shown similar to that of FIG. 6A except that the contact does not have a dependent flange as shown before. Components in this Figure having the same structure bear the same reference numerals as before.

Referring to FIGS. 6C and 7C, a contact is shown that is similar to that of FIG. 6B. Again, components having the same structure bear the same reference numerals. This contact is modified to have a transverse branch 38B' with a V-shaped notch 38E. V-shaped notch 38E has the mechanical advantage associated with a ramp or a wedge.

The quality of the electrical contact is determined, in part, by the force between the notch 38E and the pin in the notch. For a circular pin thrust in a lateral direction into notch 38E, the contact force will be normal to the edges of notch 38E, and radial to the circular pin. For a lateral pin force P directed at an angle bisecting the jaws of notch 38E, the contact force N normal to the edges of notch 38E are given by:

$$N = P/\sin(b/2)$$

where b is the angle of the notch 38E. For example, if the notch angle is 90°, the mechanical advantage is 1.41. Alternatively, with a notch angle of 60° the mechanical advantage is 2. Thus, by the expedient of employing a notch, effective contact force can be multiplied to enhance the quality of the connection.

Referring again to FIG. 4, plate 10 is shown shifted to the right along direction 20 into a released position. The released position is achieved by rotating shaft 26 so that eccentricity 26A moves vertically to the position shown. In this position, lever 22 (not visible in this view) is vertical. Under these circumstances, plate hole 14 is aligned with the gap between contact flange 38D and the opposite wall of receptacle 28. Consequently, pin 42 can be inserted through hole 14 into receptacle 28 with zero insertion force, since pin 42 need not touch or deflect contact 38.

To facilitate an understanding of the principles associated with the foregoing apparatus, its operation will be briefly described in connection with FIGS. 4 and 5. After pins, such as pin 42, are inserted into the holes 14 in receptacles 28. The lever 22 (see FIG. 1) can rotate shaft 26 and its eccentricity 26A from the position shown in FIG. 4 to that of FIG. 5. As a result, eccentricity 26A bears against leaf spring 34, deflecting it as shown in FIG. 3. Consequently, force applied through boss 30 moves plate 10 (to the left as shown in FIG. 5). When plate 10 moves to the engaged position shown in FIG. 5, pin 42 is driven against the branch flange 38D of contact 38. Contact 38 need not be designed to deflect since its main branch 38A bears against support wall 28A of receptacle 28. Plate 10 starts its movement with virtually no resistance to its motion until the pins 42 touch the branch flanges 38D of contacts 38. At this point spring 34 starts to deflect and increases this deflection as determined by eccentricity 26A. The deflection of spring 34 thus controls and defines the force P exerted by pins 42 against flanges 38D of contacts 38, increasing to its maximum when the eccentricity 26A is in the position shown in FIG. 5. This action also provides accommodation for variances in pin and contact positioning in manufacturing.

Referring now to FIG. 9, an alternate socket is illustrated with a base 12A and plate 10A similar to those described above, except the previously illustrated lever and crankshaft are replaced with a vertically aligned camshaft 46. Camshaft 46 is a cylindrical rod with a cylindrical eccentricity 46A. Instead of a T-shaped channel (channel 24 of FIG. 3), base 12A has a blind cylindrical hole 48 to rotatably support the lower end of camshaft 46. An enlarged cylindrical chamber 50 is located above blind hole 48. The upper end of shaft 46 extends through a slot in plate 10A. By rotating the upper end of shaft 46 by a screwdriver or other means, eccentricity 46A can be turned against or retracted from leaf spring 34. Reacting to this force, plate 10A moves and operates in a manner identical to that described before in connection to FIGS. 4 and 5. Specifically, electrical contact can be made with the pins of the electrical element inside the socket.

Referring to FIG. 10, modified base 12B still has blind hole 48 to rotatably support previously illustrated camshaft 46 and its eccentricity 46A. A blind cylindrical hole 32A replaces the previously illustrated cavity. Compression spring 52 occupies hole 32A. In a manner similar to that described for FIG. 9, camshaft 46 can be rotated to drive eccentricity 46A against compression spring 52 to compress it and drive plate 10B to the left (this view). In a manner identical to that described before, electrical contact can be made with the pins of the electrical element inside the socket.

Figure 11:
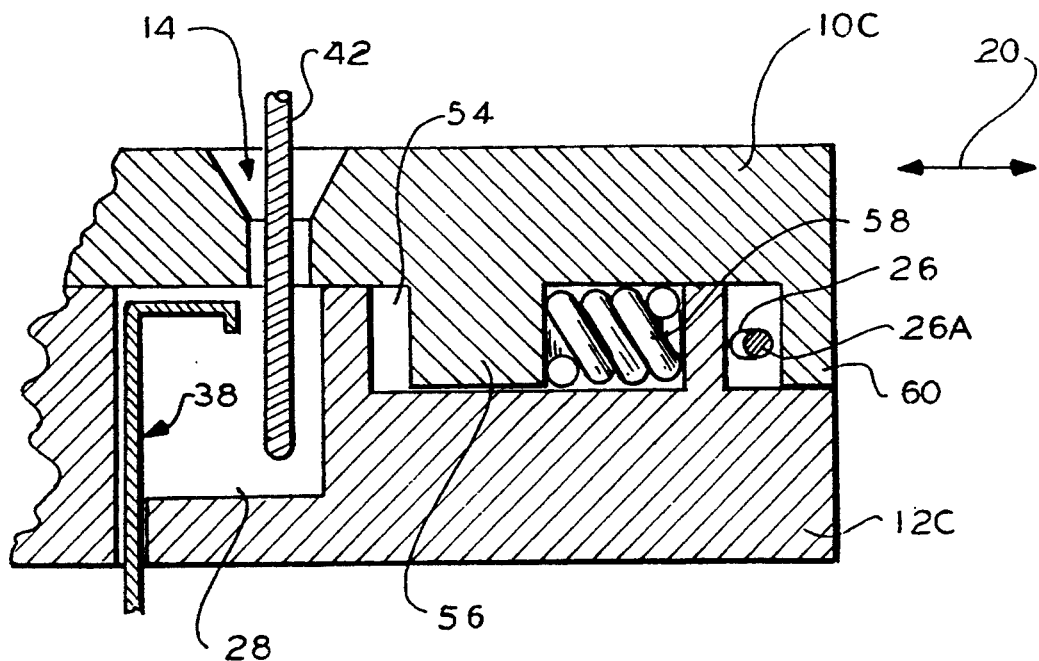
FIG. 11 is a cross-sectional view of a socket and drive mechanism that is an alternate to that of FIG. 5.

Referring to FIG. 11, base 12C is similar to previously illustrated bases, except it has slot 54 extending in direction 20. Slidably mounted atop base 12C is a similar plate 10C, which has a dependent boss 56 slidably mounted in slot 54. Plate 10C has as before a plurality of pin insertion holes 14 for receiving pins 42 of an electrical element. Base 12C also has a number of receptacles 28 for holding electrical contacts 38. Mounted to the right (this view) of boss 56 in slot 54 is compression spring 58. As such, spring 58 tends to drive plate 10C to the left, along direction 20. The right upper edge of base 12C is undercut to receive previously mentioned crankshaft 26, having eccentricity 26A. Crankshaft 26 is held in place by a rear wall 60 depending from the right end (this view) of plate 10C.

Figure 12:
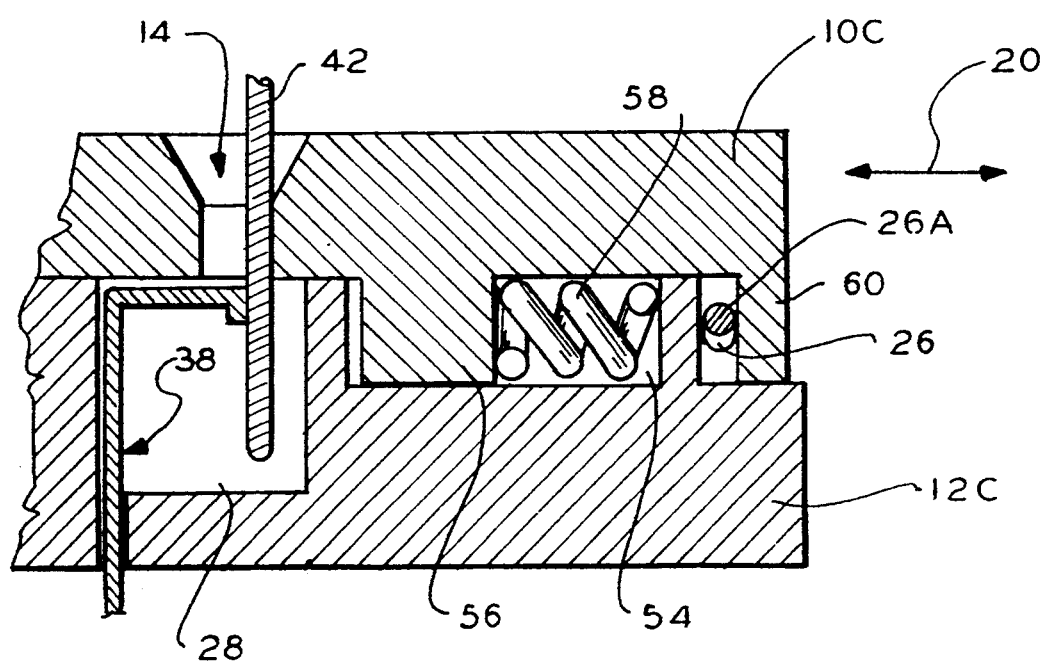
FIG. 12 is a cross-sectional view of the socket and drive mechanism of FIG. 11, but with the top plate shifted to the engaged position.

Crankshaft 26, when rotated to the position shown in FIG. 11, drives plate 10C to the right as shown. Consequently, boss 56 moves to the right to compress spring 58 within slot 54. As a result, pin insertion hole 14 is aligned with the space between contact 38 and the opposing wall of receptacle 28. As before, pins such as pin 42 can be inserted into the socket with zero insertion force. Afterward, shaft 26 can be rotated to bring eccentricity 26A into the position shown in FIG. 12. As a result, spring 58 drives plate 10C and pin 42 to engage the transverse end of contact 38. In the condition shown in FIG. 12, contact 38 need not deflect but the connection between pin 42 and contact 38 is still elastic or giving. Instead of contact deflection, compression spring 58 provides the give for all of the contacts such as contact 38.

It is to be appreciated that various modifications may be implemented with respect to the above described preferred embodiments. For example, the contacts in the receptacle can have various shapes and may be bent at obtuse angles, have domed projections, etc. Also, the contacts may be formed of various metals and may be plated with gold, silver or otherwise. Also, the pin configuration presented by the plate and base can be altered depending upon the type of electrical element being served. Additionally, the drive means can take any one of several forms and can include such driving elements as a worm gear, a wedge, a ratchet, etc. Moreover, the crankshaft or camshaft can be positioned at various angles and may work with or without a lever. Also, the spring described herein can be positioned in various locations in the plate or the base. The base and sliding plate can be made of various plastics, ceramics or other insulating materials. Also the overall dimensions and the size of components can be altered depending upon the electrical element being connected to, the desired strength, structural rigidity, thermal stability, etc.

Obviously, many modifications and variations of the present invention are possible in light of the above teachings. It is therefore to be understood that within the scope of the appended claims, the invention may be practiced otherwise than as specifically described.

I claim:

1. A socket for connecting to a plurality of dependent pins on an electrical element, comprising:
   an insulative base having a plurality of receptacles each adapted to receive an electrical contact;
   a plurality of discrete contacts separately mounted in corresponding ones of said receptacles in said insulative base;
   a plate mounted upon said insulative base to slide between an engaged position and a released position, said plate having a plurality of pin insertion holes distributed in a pattern matching that of said receptacles in said insulative base, said plate in said released position allowing insertion of said dependent pins without deflecting said contacts in said receptacles, said plate being spaced from said contacts to allow said plate to slide between said engaged and said released position without touching said contacts;
   biasing means mounted between said plate and said base for urging said plate toward said engaged position; and
   drive means mounted between said base and said plate for relatively driving them.

2. A socket according to claim 1 wherein said biasing means comprises a spring positioned to have increased spring force as said plate moves from said engaged to said released position.

3. A socket according to claim 2 wherein said spring bears against said plate and said base without touching said drive means.

4. A socket according to claim 1 wherein said drive means is operable to increase spring force on said spring and thereby drive said plate toward said engaged position.

5. A socket according to claim 1 wherein said biasing means is located between said plate and said drive means.

6. A socket according to claim 1 wherein said biasing means yields to a greater extent than said contacts in response to said plate sliding from said released to said engaged position to move said pins against said contacts.

7. A socket according to claim 1 wherein said contacts are mounted to be relatively rigid.

8. A socket according to claim 1 wherein said contacts do not deform substantially in response to said plate sliding from said released to said engaged position to move said pins against said contacts.

9. A socket according to claim 1 wherein said receptacle has a support wall, each of said discrete contacts being mounted adjacent to said support wall to restrict deflection of said discrete contacts when said plate is driven toward said engaged position.

10. A socket according to claim 9 wherein said discrete contacts each have a main branch descending into its receptacle adjacent said support wall and a transverse branch extending across said receptacle for contacting said dependent pins.

11. A socket according to claim 10 wherein said transverse branch has a dependent terminal flange.

12. A socket according to claim 1 wherein said discrete contacts each have a main branch descending into its receptacle and a transverse branch extending across said receptacle for contacting said dependent pins, said transverse branch having a V-shaped notch into which said dependent pin can be wedged.

13. A socket according to claim 1 wherein said biasing means comprises a spring.

14. A socket according to claim 1 wherein said drive means comprises a cam.

15. A socket according to claim 1 wherein said biasing means comprises a leaf spring mounted in a position transverse to motion between said engaged and said released positions.

16. A socket according to claim 14 wherein said drive means comprises a camshaft.

17. A socket according to claim 16 wherein said drive means comprises a lever extending outside said base for manually rotating said camshaft.

18. A socket according to claim 16 wherein said camshaft is mounted parallel to said receptacles.

19. A socket according to claim 1 wherein said drive means comprises a crankshaft mounted in a position transverse to motion between said engaged and said released positions.

20. A socket according to claim 19 wherein said biasing means comprises a leaf spring mounted parallel to said crankshaft.

21. A socket according to claim 1 wherein said biasing means comprises a coil spring aligned with motion between said engaged and said released positions.

22. A socket for connecting to a plurality of dependent pins on an electrical element, comprising:
   an insulative base having a plurality of receptacles, each having a support wall and each being adapted to receive an electrical contact;
   a plate mounted upon said insulative base to slide between an engaged position and a released position, said plate having a plurality of pin insertion holes distributed in a pattern matching that of said receptacles in said insulative base, said plate in said released position allowing insertion of said dependent pins without deflecting contacts in said receptacles;
   a plurality of discrete contacts separately mounted in corresponding ones of said receptacles in said insulative base, each of said discrete contacts being mounted adjacent to said support wall to restrict deflection of said discrete contacts when said plate is driven toward said engaged position, said discrete contacts each having a main branch descending into its receptacle adjacent said support wall and a transverse branch extending across said receptacle for contacting said dependent pins;
   biasing means mounted between said plate and said base for urging said plate toward said engaged position; and
   drive means mounted between said base and said plate for relatively driving them.

23. A socket for connecting to a plurality of dependent pins on an electrical element, comprising:
   an insulative base having a plurality of receptacles each adapted to receive an electrical contact;
   a plurality of discrete contacts separately mounted in corresponding ones of said receptacles in said insulative base, said discrete contacts each having a main branch descending into its receptacle and a transverse branch extending across said receptacle for contacting said dependent pins, said transverse branch having a V-shaped notch into which said dependent pin can be wedged;
   a plate mounted upon said insulative base to slide between an engaged position and a released position, said plate having a plurality of pin insertion holes distributed in a pattern matching that of said receptacles in said insulative base, said plate in said released position allowing insertion of said dependent pins without deflecting contacts in said receptacles;
   biasing means mounted between said plate and said base for urging said plate toward said engaged position; and
   drive means mounted between said base and said plate for relatively driving them.

* * * * *